United States Patent
Mueller

(10) Patent No.: US 6,507,046 B2
(45) Date of Patent: Jan. 14, 2003

(54) HIGH-RESISTIVITY SILICON CARBIDE SUBSTRATE FOR SEMICONDUCTOR DEVICES WITH HIGH BREAK DOWN VOLTAGE

(75) Inventor: Stephan Mueller, Durham, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 09/853,375

(22) Filed: May 11, 2001

(65) Prior Publication Data

US 2002/0167010 A1 Nov. 14, 2002

(51) Int. Cl.[7] ........................................... H01L 31/0312
(52) U.S. Cl. .......................................... 257/77; 257/330
(58) Field of Search .......................... 257/77; 438/268; 252/62.3; 437/175, 69; 357/16

(56) References Cited

U.S. PATENT DOCUMENTS

| | | | |
|---|---|---|---|
| 4,532,533 A | * 7/1985 | Jackson et al. | 357/16 |
| 5,019,530 A | * 5/1991 | Kleinsasser et al. | 437/175 |
| 5,135,885 A | 8/1992 | Furukawa et al. | |
| 5,611,955 A | * 3/1997 | Barrett et al. | 252/62.3 |
| 5,719,409 A | 2/1998 | Singh et al. | |
| 5,804,482 A | * 9/1998 | Konstantinov et al. | 438/268 |
| 5,831,288 A | 11/1998 | Singh et al. | |
| 6,107,142 A | 8/2000 | Suvorov et al. | |
| 6,180,958 B1 | * 1/2001 | Cooper, Jr. | 257/77 |
| 6,218,680 B1 | * 4/2001 | Carter, Jr. et al. | 257/77 |
| 6,362,495 B1 | * 3/2002 | Schoen et al. | 257/77 |

FOREIGN PATENT DOCUMENTS

| EP | 08139048 | 5/1996 |
|---|---|---|
| EP | 10067600 | 3/1998 |

OTHER PUBLICATIONS

M. Syvajarvi et al.; "Liquid phase epitaxial growth of SiC"; Journal of Crystal Growth; Feb. 1, 1999; pp. 147–154; vol. 197, No. 1–2; North–Holland Publishing Co.; Amsterdam, NL.

D. Aberg et al; "Low–dose ion implanted epitaxial 4H–SiC investigated by deep level transient spectroscopy"; 20th International Conference on Defects in Semiconductors, ICDS–20, Berkley, CA; Jul. 26–30, 1999; Physica B, vol. 273–274; pp. 672–676; Dec. 1999; Elesevier Science B.V., Netherlands.

Barrett, et al., Growth of large SiC single crystals, Journal of Crystal Growth, Mar. 1993, vol. 128, No. 1/04; North–Holland Publishing Co., Amsterdam.

Mitchell, et al., Fermi level control and deep levels in semi–insulating 4H–SiC; Journal of Applied Physics, Nov. 1, 1999, vol. 86, No. 9; American Institute of Physics.

* cited by examiner

*Primary Examiner*—Hoai Ho
*Assistant Examiner*—Thinh Nguyen
(74) *Attorney, Agent, or Firm*—Summa & Allan, P.A.

(57) ABSTRACT

A high-resistivity silicon carbide single crystal is disclosed that includes at least one compensated dopant having an electronic energy level far enough from an edge of the silicon carbide bandgap to avoid conductive behavior, while far enough from mid-gap towards the band edge to create a greater band offset than do mid-level states when the substrate is in contact with a doped silicon carbide epitaxial layer and when the net amount of the dopant present in the crystal is sufficient to pin the Fermi level at the dopant's electronic energy level. The silicon carbide crystal has a resistivity of at least 5000 ohms-centimeters at room temperature.

67 Claims, 4 Drawing Sheets

HIGH-RESISTIVITY SILICON CARBIDE SUBSTRATE FOR SEMICONDUCTOR DEVICES WITH HIGH BREAK DOWN VOLTAGE

FIELD OF THE INVENTION

The present invention relates to semiconductor materials required for high frequency devices, and in particular, relates to high-resistivity silicon carbide materials.

BACKGROUND OF THE INVENTION

The present invention relates to modern semiconductor electronic devices and the semiconductor materials required for those devices. Semiconductor materials are useful based on their intrinsic properties as well as the properties they exhibit when doped with donor or acceptor atoms. Additionally, other semiconductor devices require portions that are insulating (of which the most familiar are the oxide insulators formed when silicon is oxidized) or semi-insulating. In particular, semi-insulating (sometimes referred to as "high resistivity") materials are useful as the substrates for a number of devices such as (but not limited to) field-effect transistors ("FETs"), an exemplary one of which is the metal-semiconductor field-effect transistor, commonly referred to as the "MESFET." Although the terms "semi-insulating" and "high-resistivity" are often used interchangeably, the invention discussed herein is best expressed in terms of high resistivity, and this convention will be used consistently throughout the Background and Description, with the understanding that such use is helpfully descriptive, rather than functionally limiting, of the invention described and claimed herein.

The theory and operation and structure of various types of FETs are generally well known to ordinary skill in this art, and thus, will not be described in detail herein. In a simple model, however, a MESFET is formed on a high-resistivity or semi-insulating substrate by placing an epitaxial layer of conductive p or n-doped material on the substrate. Source, gate, and drain contacts are then made to the epitaxial layer, and when a potential (voltage) is applied to the gate, it creates a depletion region that pinches off the channel between the source and drain thereby turning the device off.

Accordingly, the performance of the MESFET depends on the quality and characteristics of the semiconductor epitaxial layer, and upon the quality of and characteristics of the high-resistivity substrate.

As wide-band gap materials, such as silicon carbide (SiC) and the Group III nitrides (e.g. GaN, AlGaN and InGaN) have become more commercially feasible, the potential for producing higher frequency MESFET's has turned into a commercial reality. Such higher frequency devices are extremely useful in a number of applications, some of the more familiar of which are power amplifiers, wireless transceivers such as cellular telephones, and similar devices.

In turn, because the wide bandgap characteristics of silicon carbide and the Group III nitrides theoretically permit devices to be designed for operation at higher frequencies and power levels, the high-resistivity substrates used for MESFETs and related devices must generally meet stricter criteria than high-resistivity or semi-insulating substrate materials used for similar devices in other materials with narrower band gaps; e.g., gallium arsenide (GaAs). Accordingly, as these higher frequency devices are developed and used, there exists an increasing demand for high quality semi-insulating silicon carbide substrates that will permit the electronic properties of wide-band gap epitaxial layers to be fully exploited.

Furthermore, the superior energy barrier produced by a high quality high-resistivity substrate offers the potential for increasing and maximizing the breakdown voltage ($V_B$) of semiconductor devices.

In conventional semi-insulating silicon carbide substrates (and in some respects, "conventional" represents a relatively recent time period), the appropriate resistivity has been obtained by doping the silicon carbide with vanadium. Vanadium creates a energy level that is about midway between the valence and conduction band in silicon carbide; i.e. at about 1.5 eV from either band edge in the 2.99 eV SiC bandgap. Doping silicon carbide with vanadium also tends to result in the vanadium compensating the residual donors (nearly always nitrogen) and acceptors (less frequently present) in silicon carbide to produce a material that is nearly insulating at room temperature. A description of such material is set forth, for example, in U.S. Pat. No. 5,611,955.

Although vanadium-doped silicon carbide is useful as a semi-insulating material for some purposes, it maintains some characteristic disadvantages. In particular, because of its amphoteric characteristics vanadium can produce either a donor or acceptor level in silicon carbide. More specifically, vanadium's acceptor level is located relatively close to the conduction band in silicon carbide. As a result, thermal excitation of electrons can occur at moderately high temperatures, thus reducing the resistivity and correspondingly reducing the functional characteristics of devices made from these materials at such slightly elevated temperatures. See, e.g., Mitchel, et. al. "Fermi-Level Control and Deep Levels in Semi-insulating 4H-SIC." *Journal of Applied Physics*, Volume 86, No. 9, Nov. 1, 1999. Additionally, in operation, electrons can get trapped in vanadium's extra level in a silicon carbide substrate, causing a time delay after injection. This tends to build up an internal charge in the semi-insulating layer, with a corresponding accumulation of holes in the epitaxial layer (speaking with reference to a MESFET) and this built-up charge does not follow the frequency being applied to the gate.

In order to avoid the problems introduced by vanadium that prevent silicon carbide and other wide-band gap devices from reaching their potential in high frequency applications, the assignee of the present invention has developed a semi-insulating silicon carbide substrate material that avoids the use of vanadium. A description and discussion of this subject matter is set forth in commonly assigned U.S. Pat. No. 6,218,680 for "Semi-Insulating Silicon Carbide Without Vanadium Dominations," and its Continuation, Ser. No. 09/757,950 filed Jan. 10, 2001. The contents of these are incorporated entirely herein by reference.

Although the material described in the '680 patent offers significant advantages over vanadium-doped material, production of the material requires dealing with the generally high native background amount of nitrogen that is almost always present in silicon carbide. The '680 patent does so in terms of compensation techniques. Even though such techniques have been proven successful, the presence of nitrogen still tends to raise difficulties and inefficiencies in the manufacturing or growth process. In particular, during sublimation growth of silicon carbide (e.g., U.S. Pat. No. RE34,861), the concentration of nitrogen tends to vary over the course of time. Additionally, for reasons that tend to be empirically observed rather than conceptually explained, the concentration of nitrogen in a growing crystal of silicon carbide tends to vary along the geometry of the crystal.

Thus, although the technique of the '680 patent has proven to be a significant improvement, it requires the elimination of nitrogen, or at a minimum, its careful control.

OBJECT AND SUMMARY OF THE INVENTION

Therefore, it is an object of the present invention to provide a high-resistivity silicon carbide substrate that has the characteristics required for successful high frequency devices, and that can be produced over a somewhat wider range of operating parameters, while still avoiding the disadvantages of vanadium and related dopants.

The invention meets this object with a high-resistivity silicon carbide single crystal that includes at least one compensated dopant having an electronic energy level far enough from an edge of the silicon carbide bandgap, or at low enough concentrations (or both), to avoid conductive behavior, while far enough from mid-gap towards the band edge to create a greater band offset than do mid-level states (e.g. traps, defects, or dopants) when the substrate is in contact with a doped silicon carbide epitaxial layer and when the net amount of the dopant present in said crystal is sufficient to pin the Fermi level at the dopant's electronic energy level, with the silicon carbide crystal having a resistivity of at least 5000 ohms-centimeters at room temperature (298K).

In preferred embodiments, the high-resistivity crystal or substrate is used in conjunction with an adjoining epitaxial layer to produce a desired band-bending effect described in more detail later herein. Furthermore, it will be understood that although an epitaxial layer represents a presently-preferred embodiment, the desired offset can also result when the high resistivity portion is adjacent any appropriate active region, including regions formed by implantation or diffusion doping rather than as distinct epitaxial layers.

As used herein, the net amount of the dopant refers to the amount that acts in doping fashion; i.e., with or without compensation by other elements or by other items such as point defects.

In this regard, those of skill in this art recognize that dopants near the edge of the bandgap are more likely to produce conductive behavior than are dopants that produce levels near or at mid-gap. This is particularly so in wide bandgap materials such as silicon carbide.

In another aspect, the invention is a high-resistivity silicon carbide single crystal comprising nitrogen and at least one acceptor element having an electronic energy level of between 0.3 and 1.4 eV relative to (i.e., above) the valence band of monocrystalline silicon carbide, with the at least one acceptor element being present in an amount that overcompensates the nitrogen and pins the Fermi level of the silicon carbide substrate to the electronic energy level of the at least one acceptor element.

In another aspect the invention is a high-resistivity silicon carbide single crystal comprising an amount of electrically active nitrogen, an amount of electronically active point defects that act as acceptors, and an amount of at least one acceptor element having an electronic energy level of between 0.3 and 1.4 eV relative to the valence band of monocrystalline silicon carbide, with the combined amount of the acceptor element and the point defects being greater than the amount of electrically active nitrogen, and any other electrically active donors, including intrinsic point defects. The resulting compensation pins the Fermi level of the silicon carbide substrate to the electronic energy level of the at least one acceptor element.

In another aspect the invention is a high-resistivity bulk single crystal of silicon carbide comprising scandium, boron and non-intentionally introduced nitrogen (i.e., nitrogen typically present, but generally not from a proactive doping step), and with the concentration of nitrogen (and any other electrically-active donors, including intrinsic point defects) being greater than the concentration of scandium, and with the concentration of boron being sufficient for the sum concentration of boron and scandium to overcompensate the nitrogen (or other electrically active donor), and pin the Fermi level of the silicon carbide to the level of the scandium.

In yet another aspect, the invention is a high-resistivity silicon carbide single crystal comprising electrically active nitrogen and electrically active intrinsic point defects that act as donors, electrically active point defects that act as acceptors, a first acceptor element having an electronic energy level of between 0.3 and 1.4 eV relative to the valence band of monocrystalline silicon carbide, and a second acceptor element having an electronic energy level of between 0.3 and 1.4 eV relative to the valence band of monocrystalline silicon carbide, with the energy level of the first acceptor element being deeper than the energy level of the second acceptor element, and with the combined amount of the acceptor elements and the acceptor-acting point defects being greater than the amount of electrically active nitrogen (and donor acting point defects), thus pinning the Fermi level of the silicon carbide substrate to the electronic energy level of the first acceptor element.

The foregoing and other objects and advantages of the invention and the manner in which the same are accomplished will become clearer based on the followed detailed description taken in conjunction with the accompanying drawings in which:

DETAILED DESCRIPTION OF THE PREFERRED EMBODIMENTS

Figure 1:
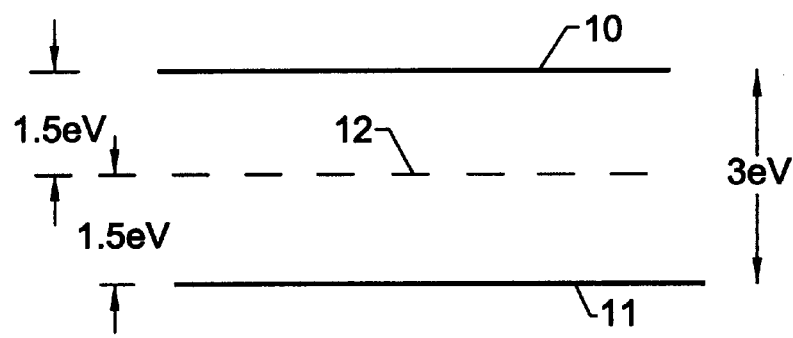
FIG. 1 is a schematic band diagram of semi-insulating silicon carbide made using vanadium.

The invention is a high-resistivity silicon carbide single crystal comprising at least one compensated dopant having an electronic energy level far enough from an edge of the silicon carbide band gap to avoid conductive behavior, while far enough from mid-gap towards the band edge to create a greater band offset than do mid-level states (e.g., traps, defects, elements) when the substrate is in contact with a doped silicon carbide epitaxial layer and when the net amount of the dopant present in the crystal is sufficient to pin the Fermi level at the dopant's electronic energy level, and with the resulting silicon carbide crystal having a resistivity of at least 5,000 ohms-centimeters at room temperature (298K).

The invention is particularly advantageous in structures in which an epitaxial layer, or a functionally equivalent active region (e.g. a diffusion-doped or implantation-doped region) is in contact with the substrate with the result that the interaction between the substrate and the epitaxial layer creates an advantageous band-bending effect as described later herein. Appropriate implantation and diffusion techniques are set forth in commonly-assigned U.S. Pat. No. 6,107,142, the contents of which are incorporated entirely herein by reference.

In some preferred embodiments, the silicon carbide crystal comprises intrinsic nitrogen and at least one acceptor element having an electronic energy level of between about 0.3 and 1.4 eV relative to the valence band of monocrystalline silicon carbide, with at least one acceptor element being present in an amount that over-compensates the nitrogen (and intrinsic point defects that act as donors) and pins the Fermi level of the silicon carbide substrate to the electronic energy level of the at least one acceptor element. In a further preferred embodiment, the high-resistivity silicon carbide single crystal will also include an amount of electronically active point defects that act as acceptors in the presence of intrinsic electrically active nitrogen. In this embodiment, the combined amount of the acceptor element and the point defects is greater than the amount of electrically active nitrogen plus the amount of intrinsic point defects that act as donors and pins the Fermi level of the silicon carbide substrate to the electronic energy level of the at least one acceptor element.

In this regard, the invention can also comprise the use of only one acceptor (e.g., boron or scandium) which has, together with the concentration of intrinsic point defects that act as acceptors, a concentration high enough to compensate the electrically active intrinsic point defects that act as donors so that the Fermi level of the substrate is pinned to this one acceptor (boron or scandium) or to an intrinsic point defect that acts as an acceptor, which point defect also has an energy level between 0.3 and 1.4 relative to the valence band.

Conceptually, the electrically active center with an energy level of 0.3–1.4 relative to the valence band does not have to be an acceptor. In principle, this electrically active center can also be a "deep" donor, including intrinsic point defects that act as donors, provided that the compensation of this deep donor by other electrically active centers results in pinning the Fermi level to the energy level of this deep donor, which has an energy level of 0.3–1.4 eV relative to the valence band. Specific deep donors for this scenario, however, have not been identified to date.

In a more preferred embodiment, the high-resistivity silicon carbide crystal comprises electrically active nitrogen, electrically active point defects that act as acceptors, a first acceptor element having an electronic energy level of between 0.3 and 1.4 eV relative to the valance band of mono-crystalline silicon carbide, and a second acceptor element having an electronic energy level of between 0.3 and 1.4 eV relative to the valance band of monocrystalline silicon carbide. In this embodiment, the energy level of the first acceptor element is deeper than the energy level of the second acceptor element, and the combined amount of the acceptor elements and the point defects are greater than the amount of electrically active nitrogen (plus the concentration of intrinsic point defects that act as donors), and pins the Fermi of the silicon carbide substrate to the electronic energy level of the first acceptor element.

In another aspect, the high-resistivity single crystal of silicon carbide according to the invention comprises intrinsic nitrogen, scandium, and boron, and wherein the concentration of nitrogen is greater than the concentration of scandium and the concentration of boron is sufficient for the sum concentration of boron and scandium to overcompensate the nitrogen (and any intrinsic point defects that act as donors) and pin the Fermi level of the silicon carbide to the level of scandium (i.e., the highest partially populated level).

In the most preferred embodiment, the high-resistivity bulk single crystal of silicon carbide comprises nitrogen in an activated concentration of between about 5E15 and 3E16 per cubic centimeter ($cm^{-3}$), boron in a concentration of 1E16 $cm^{-3}$, scandium in a concentration of between about 1E15 and 2E16 $cm^{-3}$, point defects in a concentration of between about 1E14 and 3E16 $cm^{-3}$, and a resistivity of at least about 5,000 ohms-centimeters at room temperature. As used herein, expressions such as "5E15" have their usual and well-understood meaning as exponential values, i.e. 5E15 $cm^{-3}$ is an abbreviation for $5 \times 10^{15}$ $cm^{-3}$.

In this regard, all of the embodiments of the invention include a silicon carbide substrate that has a resistivity of at least 5,000 ohms-centimeters at room temperature, more preferably a resistivity of at least 10,000 ohms-centimeters at room temperature, and most preferably at least 50,000 ohms-centimeters at room temperature.

As set forth in the Background, and as will be illustrated with respect to the description of the drawings herein, the invention is also best understood in conjunction with an overall semiconductor structure. In turn, such semiconductor structures are part of semiconductor devices, particularly transistors, frequently field-effect transistors and related devices. In this regard, the invention further comprises a semiconductor structure comprising an epitaxial layer of silicon carbide on a silicon carbide substrate as described herein. Furthermore, because the most common intrinsic doping element in silicon carbide is nitrogen, the compensating atoms will be donors such as scandium and boron, and thus, the semi-insulating silicon carbide structure will often be used in conjunction with an n-type epitaxial layer of silicon carbide.

Thus, in another aspect, the invention comprises a transistor, and in particular a field-effect transistor, that includes a semiconductor structure that incorporates the epitaxial layer and silicon carbide substrates described herein.

The polytype of the silicon carbide used in the high-resistivity single crystal substrates and epitaxial layers is preferably selected from the group consisting of the 3C, 4H, 6H, and 15R polytypes of silicon carbide.

The growth of silicon carbide epitaxial layers ("epilayers") on silicon carbide substrates is exemplified by the disclosures of, for example, U.S. Pat. Nos. 4,912,064; 5,011,549 and 5,119,540 and will not be otherwise discussed in detail herein. Such growth has become relatively well established in the art and can be carried out by those persons of ordinary skill in the art and without undue experimentation.

In many aspects, the invention can be best understood when taken in conjunction with the drawings. It will be understood that for the sake of clarity the drawings are somewhat simplified in nature. In particular, the drawings illustrate the manner in which the invention incorporates specific dopant elements. The drawings do not, however, attempt to diagram the band location or energy levels of intrinsic point defects, but it will be understood that such diagrams would be consistent with those that illustrate the energy levels of particular dopants.

FIG. 1 is a schematic diagram of the bandgap (approximately 3 eV) of silicon carbide and showing the trapping level produced by vanadium (V) which creates a Fermi level about 1.5 eV away from the conduction band 10 and the valance band 11 of the silicon carbide. In general, FIG. 1 is schematically illustrative of the prior art.

Figure 2:
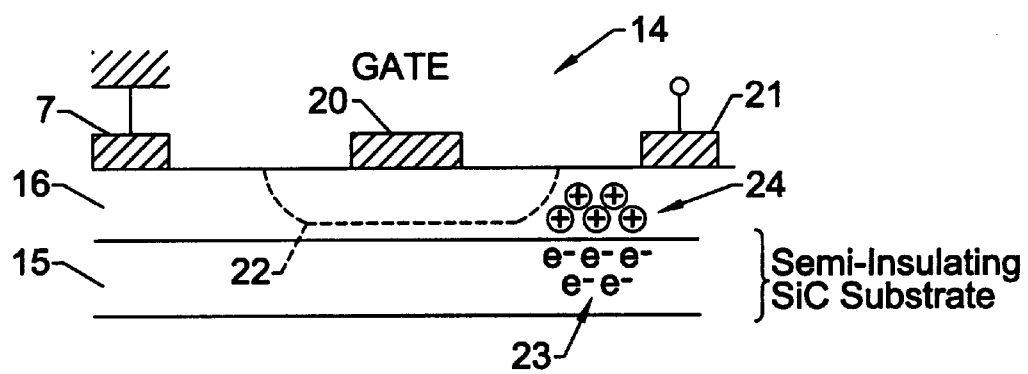
FIG. 2 is a diagram of a basic metal-semiconductor field-effect transistor (MESFET) schematically illustrating the undesired gathering of electrons in silicon carbide material of the type schematically illustrated in FIG. 1.

FIG. 2 is a schematic cross sectional diagram of a metal-semiconductor field-effect transistor (MESFET) broadly designated at 14. The MESFET 14 includes the semi-insulating silicon carbide substrate 15, and an n-type silicon carbide epitaxial layer 16. Depending on the MESFET's design and purpose, the epitaxial layer can be either p-type or n-type but is most commonly n-type. A source contact is illustrated at 17, a gate contact at 20 and a drain contact at 21. As well understood by those of ordinary skill in this art, the application of a negative potential to the gate 20 creates a depletion region illustrated by the broken line 22 that modulates the conductivity of the channel.

The operation of MESFETs and many other semiconductor devices are generally well-understood in the art. Appropriate discussions are available from a wide variety of sources, with an exemplary source being Sze, *Physics of Semiconductor Devices*, 2d Ed (1981) John Wiley & Sons, Inc., and its companion, Sze, *Modern Semiconductor Device Physics*, (1998) John Wiley & Sons, Inc. In this regard, although the present invention is described herein in terms of a MESFET structure, it will be understood that the invention has application to other device structures.

As an introduction to the advantages of the invention, FIG. 2 also schematically illustrates a plurality of trapped electrons grouped at 23, and the corresponding group of holes 24 attracted by the electrons 23. The exact mechanism of the trapping and "backgating" effect in MESFET operation is not fully understood. Although the inventors do not wish to be bound by any particular theory, it appears possible that because of the high electric fields involved in the SiC MESFET operation, the electrons may be trapped for some time in the previously empty donor states of vanadium.

Figure 3:
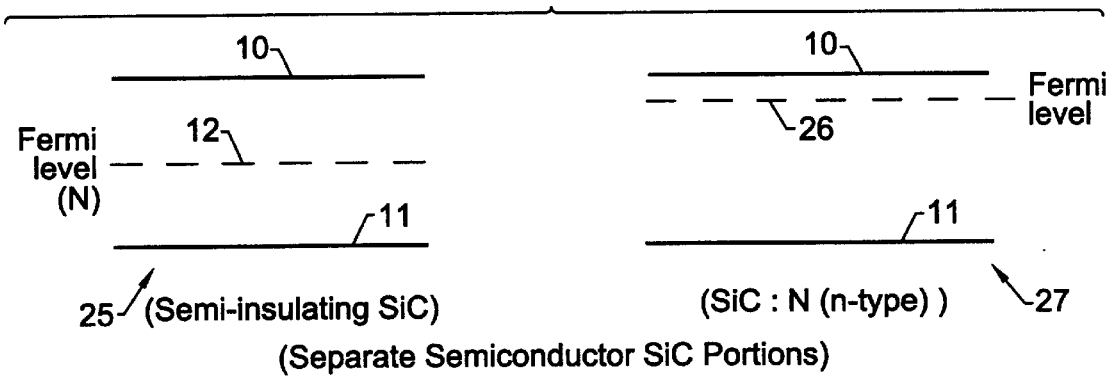
FIG. 3 illustrates band diagrams for semi-insulating silicon carbide using vanadium as illustrated in FIG. 1 and n-type silicon carbide doped with nitrogen.
Figure 4:
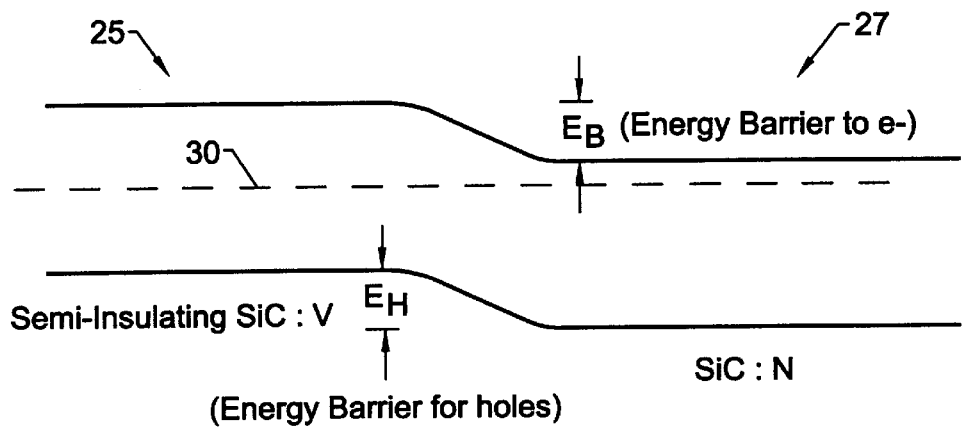
FIG. 4 illustrates the band-bending that occurs when the materials illustrated in FIG. 3 are adjacent one another as in a substrate-epilayer relationship.

FIGS. 3 and 4 are band diagrams that illustrate the characteristics obtained when the vanadium-doped semi-insulating silicon carbide is brought into contact (usually in the relationship of substrate and epilayer) with n-type silicon carbide that has been doped with nitrogen.

FIG. 3 is somewhat similar to FIG. 1 in that it illustrates the semi-insulating silicon carbide broadly designated at 25, along with its valance band 11, conduction band 10, and Fermi level 12. The right hand portion of FIG. 3 similarly illustrates a sample of a silicon carbide epitaxial layer doped n-type with nitrogen, which likewise has the same valance band 11 and the same conduction band 10, but has it's Fermi level 26 at a different position than the substrate doped with vanadium.

The position of the Fermi levels 12 and 26 and the theory behind such positions are generally well understood in this art (e.g. the Sze references listed previously), and will not be explained herein in detail, other than is necessary to describe the invention.

FIG. 4 illustrates the bandgap when the epitaxial layer 27 and the semi-insulating silicon carbide substrate are brought together (i.e. as substrate and epilayer) as is the case in a typical field effect transistor. First, as well understood from band theory, when the two materials are brought together, the Fermi level equilibrates between them, and such is illustrated by the broken line 30 in FIG. 4. Because of the common Fermi level 30, and because the relationships between the Fermi level 30 and the conduction and valance bands remain similar in the semi-insulating 25 and the epitaxial portion 27 of FIG. 4, the conduction and valance bands are offset from one another and create an energy barrier, designated $E_B$ in FIG. 4 to the flow of electrons (from right to left in FIG. 4) from the epitaxial layer to the substrate, and a corresponding barrier $E_H$ to the flow of holes (left to right) from the substrate 25 to the epitaxial layer 27.

As is well understood by those of ordinary skill in basic quantum mechanics, the probability that an electron can surmount or tunnel through the barrier $E_B$ illustrated in FIG. 4 depends upon a number of factors, but one of the most significant of which is the size (height) of the barrier. Thus, all other factors being equal, the greater the energy barrier $E_B$ (and the corresponding barrier EH), the fewer electrons and holes will be able to move back and forth between the semi-insulating substrate 25 and the epitaxial layer 27. Because the prevention of such flow is one of the objects of a high-resistivity substrate for a field effect transistor, the greater the barriers $E_B$ and $E_H$ can be made, the better a resulting device is expected to perform. Furthermore, the larger the barriers $E_B$ and $E_H$, the greater the breakdown voltage ($V_B$) of the resulting device.

Figure 5:
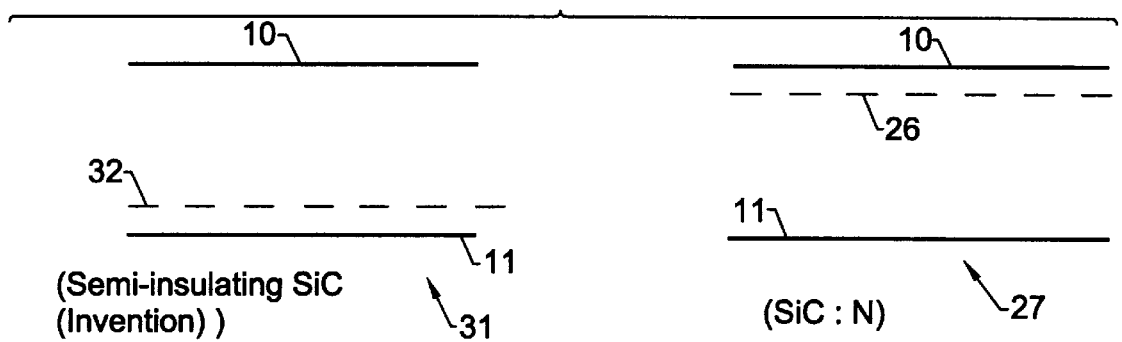
FIG. 5 is a pair of band diagrams similar to FIG. 3, but in which the semi-insulating silicon carbide has a Fermi level according to the present invention.
Figure 6:
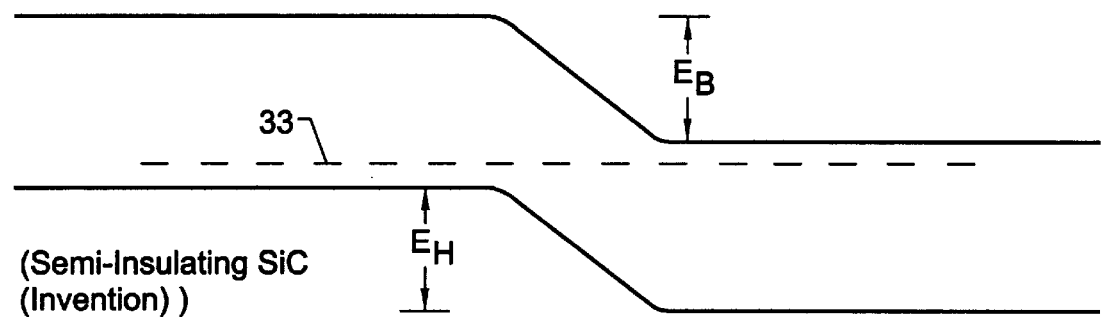
FIG. 6 is a band diagram similar to FIG. 4, but showing the band-bending that occurs when the semi-insulating silicon carbide according to the invention is adjacent nitrogen-doped n-type silicon carbide.

FIGS. 5 and 6 are band diagrams that in general correspond to the illustrations in FIGS. 3 and 4, but with FIGS. 5 and 6 illustrating the advantages of the present invention. First, in FIG. 5, the high-resistivity material according to the present invention is broadly designated at 31. As in FIGS. 1 and 3, the conduction band is illustrated at 10, and the valance band at 11. Because the invention changes the Fermi level of the substrate, however, the Fermi level is illustrated at 32 in FIG. 5. The right-hand portion of FIG. 5 is otherwise identical to the right-hand portion of FIG. 3, and shows the n-type, nitrogen-doped silicon carbide epitaxial layer 27, along with its conduction band 10, valance band 11, and Fermi level 26.

A comparison of FIG. 5 with FIG. 3 shows that the difference between the Fermi level 32 of the substrate and the Fermi level 26 of the n-type epitaxial layer 27 is significantly greater than the corresponding differences illustrated in FIG. 3.

Accordingly, FIG. 6 illustrates the bandgap diagram when the epitaxial layer 27 is on the substrate 31 according to the present invention. The resulting Fermi layer is illustrated at 33. In the manner just described with respect to FIG. 4, because of the common Fermi level of the materials in contact, the conduction and valance bands are offset from one another when the materials are in contact. Furthermore, because the bands of FIGS. 5 and 6 must move further relative to each other to maintain the common Fermi level 33, the barrier to electrons $E_B$ illustrated in FIG. 6 is much greater than the same barrier in FIG. 4. In the same manner, the barrier to holes $E_H$ is similarly higher than the corresponding banner in the material schematically illustrated in FIG. 4. Accordingly, as expected and as discussed with respect to FIG. 4, the probability that electrons will cross the barrier $E_B$ (and that holes will cross the barrier $E_H$) is significantly reduced using the high-resistivity silicon carbide substrate of the present invention. As a result, field effect transistors formed on the substrates of the present invention can be expected to perform much better than those formed on the materials schematically illustrated in FIG. 4.

Figure 7:
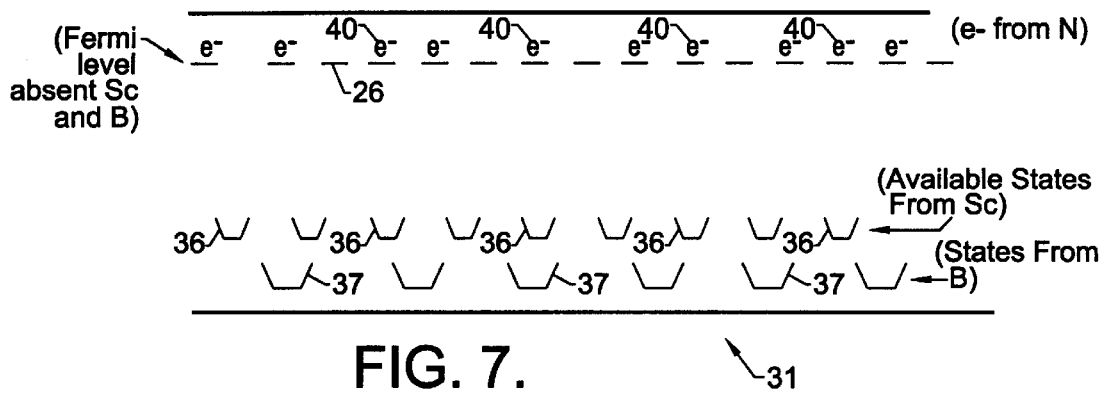
FIG. 7 is another band diagram for silicon carbide and showing the position of the Fermi level in the absence of the dopants according to its present invention, and also showing the potentially available states when dopants according to the present invention are included.
Figure 8:
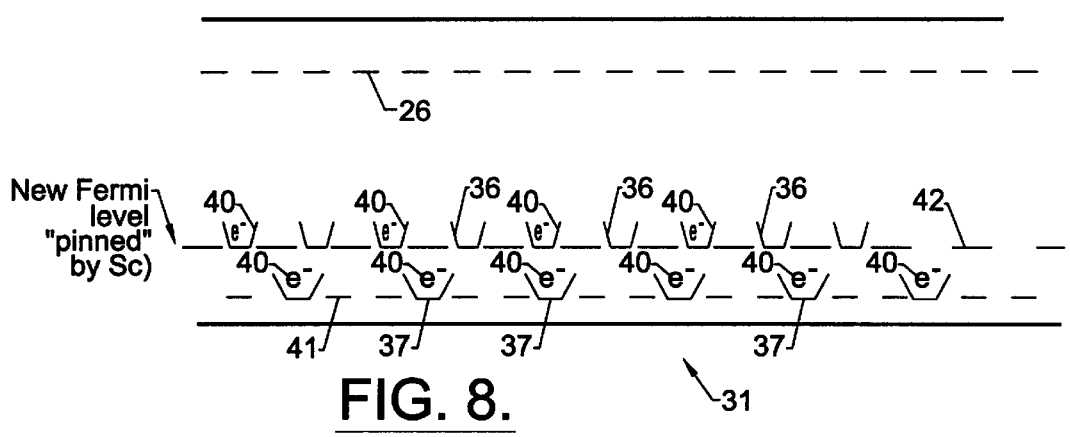
FIG. 8 is a schematic band diagram of the semi-insulating silicon carbide according to the present invention showing a new Fermi level pinned by the available states provided by the present invention.

FIGS. 7 and 8 illustrate in schematic fashion some of the numerical relationships between donors, acceptors, and available states that are set forth herein and in the claims. Both FIG. 7 and FIG. 8 schematically illustrate the bandgap of the semi-insulating material 31 according to the present invention consistent with FIG. 5 in this use of the reference numerals. Similarly, FIGS. 7 and 8 show the Fermi level 26 established when nitrogen alone (at least in an amount sufficient to affect the properties of the crystal) is present in the substrate. FIGS. 7 and 8 also illustrate, however, a plurality of available states, some of which 36 are provided by the presence of scandium, and others of which 37 are provided by boron.

In order to illustrate the invention straightforwardly, and in somewhat simplified fashion, FIG. 7 illustrates ten electrons 40 populating the Fermi level 26 as they would in the absence of the doping according to the present invention. In the absence of doping according to the invention, these electrons would represent the highest filled or partially filled band in the material, and would thus establish the Fermi level.

As FIG. 8 illustrates, however, when the exemplary boron and scandium are present and create the respective states 37 (from boron) and 36 (from scandium), the electrons that would otherwise populate the original Fermi level 26 instead preferentially fill the lowest available energy level, which in this case, is represented by the dashed line 41 in FIG. 8. Because FIG. 8 has been illustrated for illustrative purposes with six available positions for the electrons 40, six of the ten electrons will populate the level 41. The remaining four electrons will populate the scandium energy level 42, that is also illustrated in FIG. 8, but will not fill it. Thus, the partially filled scandium level 42 establishes the Fermi level for the material. By doing so, the Fermi level is said to be "pinned" to the scandium dopant in the silicon-carbide semi-insulating material.

The invention has been described in detail, with reference to certain preferred embodiments, in order to enable the reader to practice the invention without undue experimentation. A person having ordinary skill in the art will readily recognize that many of the components and parameters may be varied or modified to a certain extent without departing from the scope and spirit of the invention. Furthermore, titles, headings, or the like are provided to enhance the reader's comprehension of this document and should not be read as limiting the scope of the present invention.

That which is claimed is:

1. A semiconductor structure comprising:
   a silicon carbide single crystal substrate; and
   a doped epitaxial layer of silicon carbide on said substrate;
   said substrate comprising at least one compensated dopant having an electronic energy level far enough from an edge of the silicon carbide bandgap to avoid conductive behavior, while far enough from mid-gap towards the band edge to create a greater band offset between said substrate and said epitaxial layer than do mid-level states when said substrate is in contact with said silicon carbide epitaxial layer and when the net amount of said dopant present in said substrate is sufficient to pin the Fermi level of said substrate at said dopant's electronic energy level; and
   said silicon carbide substrate having a resistivity of at least 5000 ohms-centimeters at room temperature (298K).

2. A semiconductor structure according to claim 1 wherein said substrate is compensated by a dopant and intrinsic point defects.

3. A semiconductor structure according to claim 2 wherein said dopant is nitrogen and said compensated dopant is scandium.

4. A semiconductor structure according to claim 3 and further comprising boron as a second compensated dopant;
   the concentration of said boron being greater than the concentration of said scandium; and
   the net concentration of said boron, said point defects and said scandium being sufficient to pin the Fermi level at the level of said scandium in the presence of said intrinsic nitrogen.

5. A silicon carbide structure according to claim 4 wherein electrons from said nitrogen fill the energy level of said boron and partially fill the energy level of said scandium.

6. A field-effect transistor that includes the semi-insulating silicon carbide substrate according to claim 5.

7. A semiconductor structure according to claim 1 wherein:
   said doped epitaxial layer is p-type; and
   said net dopant in said substrate is n-type.

8. A semiconductor structure according to claim 1 wherein:
   said doped epitaxial layer is n-type; and
   said net dopant in said substrate is p-type.

9. A silicon carbide structure according to claim 1 wherein the polytype of the silicon carbide is selected from the group consisting of the 3C, 4H, 6H and 15R polytypes.

10. A silicon carbide structure according to claim 1 having a resistivity of at least 10,000 ohms-centimeters at room temperature.

11. A silicon carbide structure according to claim 1 having a resistivity of at least 50,000 ohms-centimeters at room temperature.

12. A silicon carbide single crystal comprising:
    nitrogen; and
    at least one acceptor element having an electronic energy level of between 0.3 and 1.4 eV relative to the valence band of mono-crystalline silicon carbide;
    said at least one acceptor element being present in an amount that over compensates the nitrogen and pins the Fermi level of said silicon carbide substrate to the electronic energy level of said at least one acceptor element.

13. A silicon carbide single crystal according to claim 12 comprising other intrinsic point defects that act as donors and wherein said at least one acceptor element is present in an amount that over compensates the nitrogen and said other intrinsic point defects that act as donors and pins the Fermi level of said silicon carbide substrate to the electronic energy level of said at least one acceptor element.

14. A silicon carbide substrate according to claim 12 wherein said acceptor element comprises scandium.

15. A silicon carbide substrate according to claim 12 wherein said acceptor element comprises boron.

16. A silicon carbide substrate according to claim 12 comprising two or more acceptor elements.

17. A silicon carbide substrate according to claim 12 wherein the polytype of the silicon carbide is selected from the group consisting of the 3C, 4H, 6H and 15R polytypes.

18. A silicon carbide substrate according to claim 12 having a resistivity of at least 5,000 ohms-centimeters at room temperature.

19. A silicon carbide substrate according to claim 12 having a resistivity of at least 10,000 ohms-centimeters at room temperature.

20. A silicon carbide substrate according to claim 12 having a resistivity of at least 50,000 ohms-centimeters at room temperature.

21. A semiconductor structure comprising an n-type doped silicon carbide epitaxial layer on a silicon carbide substrate according to claim 12.

22. A field effect transistor that includes a semiconductor structure according to claim 21.

23. A silicon carbide single crystal comprising;
an amount of electrically active nitrogen;
an amount of electrically active point defects that act as acceptors; and
an amount at least one acceptor element having an electronic energy level of between 0.3 and 1.4 eV relative to the valence band of mono-crystalline silicon carbide;
wherein the combined amount of said acceptor element and said point defects is greater than said amount of electrically active nitrogen and pins the Fermi level of said silicon carbide single crystal to the electronic energy level of said at least one acceptor element.

24. A silicon carbide single crystal according to claim 23 wherein said acceptor element comprises scandium.

25. A silicon carbide single crystal according to claim 23 wherein said acceptor element comprises boron.

26. A silicon carbide single crystal according to claim 23 wherein the polytype of the silicon carbide is selected from the group consisting of the 3C, 4H, 6H and 15R polytypes.

27. A silicon carbide single crystal according to claim 23 having a resistivity of at least 5,000 ohms-centimeters at room temperature.

28. A silicon carbide single crystal according to claim 23 having a resistivity of at least 10,000 ohms-centimeters at room temperature.

29. A silicon carbide single crystal according to claim 23 having a resistivity of at least 50,000 ohms-centimeters at room temperature.

30. A semiconductor structure comprising an n-type epitaxial layer of silicon carbide on a silicon carbide single crystal substrate according to claim 23.

31. A field effect transistor that includes a semiconductor structure according to claim 30.

32. A bulk single crystal of silicon carbide comprising:
non-intentionally introduced nitrogen;
scandium; and
boron; and wherein
the concentration of nitrogen is greater than the concentration of scandium; and
the concentration of boron is sufficient for the sum concentration of boron and scandium to overcompensate the nitrogen, and pin the Fermi level of said silicon carbide to the level of said scandium.

33. A semiconductor structure comprising an n-type epitaxial layer of silicon carbide on a silicon carbide substrate according to claim 32.

34. A field effect transistor that includes a semiconductor structure according to claim 33.

35. A silicon carbide single crystal according to claim 32 wherein the polytype of the silicon carbide is selected from the group consisting of the 3C, 4H, 6H and 15R polytypes.

36. A silicon carbide single crystal according to claim 32 having a resistivity of at least 5,000 ohms-centimeters at room temperature.

37. A silicon carbide single crystal according to claim 32 having a resistivity of at least 10,000 ohms-centimeters at room temperature.

38. A silicon carbide substrate according to claim 32 having a resistivity of at least 50,000 ohms-centimeters at room temperature.

39. A bulk single crystal of silicon carbide comprising:
nitrogen in a concentration of between about 5E15 and 3E16 $cm^{-3}$;
boron in a concentration of 1E16 $cm^{-3}$;
scandium in a concentration of between about 1E15 and 2E16 $cm^{-3}$;
point defects in a concentration of between about 1E14 and 3E16 $cm^{-3}$; and
a resistivity of at least 5000 $\Omega$-cm at room temperature.

40. A semiconductor structure comprising an n-type epitaxial layer of silicon carbide on a silicon carbide substrate according to claim 39.

41. A metal-semiconductor field effect transistor comprising respective source gate and drain contacts on a semiconductor structure according to claim 40.

42. A silicon carbide single crystal according to claim 39 wherein the polytype of the silicon carbide is selected from the group consisting of the 3C, 4H, 6H, and 15R polytypes.

43. A silicon carbide single crystal according to claim 39 having a resistivity of at least 5,000 ohms-centimeters at room temperature.

44. A silicon carbide single crystal according to claim 39 having a resistivity of at least 10,000 ohms-centimeters at room temperature.

45. A silicon carbide single crystal according to claim 39 having a resistivity of at least 50,000 ohms-centimeters at room temperature.

46. A silicon carbide single crystal comprising;
electrically active nitrogen;
electrically active point defects that act as acceptors;
a first acceptor element having an electronic energy level of between 0.3 and 1.4 eV relative to the valence band of mono-crystalline silicon carbide; and
a second acceptor element having an electronic energy level of between 0.3 and 1.4 eV relative to the valence band of mono-crystalline silicon carbide;
said energy level of said first acceptor element being deeper than the energy level of said second acceptor element;
the concentration of said second acceptor element being greater than the amount of said first acceptor element; and
the combined amount of said acceptor elements and said point defects being greater than said amount of electrically active nitrogen and pins the Fermi level of said silicon carbide substrate to the electronic energy level of said first acceptor element.

47. A semiconductor structure comprising an n-type epitaxial layer of silicon carbide on a silicon carbide substrate according to claim 46.

48. A field effect transistor that includes a semiconductor structure according to claim 47.

49. A silicon carbide single crystal according to claim 46 wherein said acceptor element comprises scandium.

50. A silicon carbide single crystal according to claim 46 wherein said second acceptor element comprises boron.

51. A silicon carbide single crystal according to claim 46 wherein the polytype of the silicon carbide is selected from the group consisting of the 3C, 4H, 6H and 15R polytypes.

52. A silicon carbide single crystal according to claim 46 having a resistivity of at least 5,000 ohms-centimeters at room temperature.

53. A silicon carbide single crystal according to claim 46 having a resistivity of at least 10,000 ohms-centimeters at room temperature.

54. A silicon carbide single crystal according to claim 46 having a resistivity of at least 50,000 ohms-centimeters at room temperature.

55. A semiconductor structure comprising:

a silicon carbide single crystal substrate; and a doped region of silicon carbide adjacent said substrate;

said substrate comprising at least one compensated dopant having an electronic energy level far enough from an edge of the silicon carbide bandgap to avoid conductive behavior, while far enough from mid-gap towards the band edge to create a greater band offset between said substrate and said doped region than do mid-level states when said substrate is in contact with said doped region and when the net amount of said dopant present in said substrate is sufficient to pin the Fermi level of said substrate at said dopant's electronic energy level; and said silicon carbide substrate having a resistivity of at least 5000 ohms-centimeters at room temperature (298K).

56. A silicon carbide structure according to claim 55 wherein said substrate is compensated by a dopant and intrinsic point defects.

57. A silicon carbide structure according to claim 56 wherein said dopant is nitrogen and said compensated dopant is scandium.

58. A silicon carbide structure according to claim 57 and further comprising boron as a second compensated dopant;

the concentration of said boron being greater than the concentration of said scandium; and the net concentration of said boron, said point defects and said scandium being sufficient to pin the Fermi level at the level of said scandium in the presence of said intrinsic nitrogen.

59. A silicon carbide structure according to claim 58 wherein electrons from said nitrogen fill the energy level of said boron and partially fill the energy level of said scandium.

60. A field-effect transistor that includes the semi-insulating silicon carbide substrate according to claim 59.

61. A semiconductor structure according to claim 55 wherein:

said adjacent doped region is p-type; and said net dopant in said substrate is n-type.

62. A semiconductor structure according to claim 55 wherein:

said adjacent doped region is n-type; and said net dopant in said substrate is p-type.

63. A silicon carbide structure according to claim 55 wherein the polytype of the silicon carbide is selected from the group consisting of the 3C, 4H, 6H and 15R polytypes.

64. A silicon carbide structure according to claim 55 having a resistivity of at least 10,000 ohms-centimeters at room temperature.

65. A silicon carbide structure according to claim 55 having a resistivity of at least 50,000 ohms-centimeters at room temperature.

66. A silicon carbide structure according to claim 55 wherein said adjacent doped region is a dopant-implanted region.

67. A silicon carbide structure according to claim 55 wherein said adjacent doped region is a dopant-diffused region.

* * * * *